United States Patent [19]
Yang et al.

[11] Patent Number: 5,598,375
[45] Date of Patent: Jan. 28, 1997

[54] STATIC RANDOM ACCESS MEMORY DYNAMIC ADDRESS DECODER WITH NON-OVERLAP WORD-LINE ENABLE

[75] Inventors: Jyh-Ren Yang; Ching-Ching Chi; Tien-Yu Wu, all of Hsinchu, Taiwan

[73] Assignee: Electronics Research & Service Organization, Hsinchu, Taiwan

[21] Appl. No.: 494,275

[22] Filed: Jun. 23, 1995

[51] Int. Cl.$^6$ .................................................. G11C 8/00
[52] U.S. Cl. ............... 365/230.06; 365/233; 365/230.08; 326/105
[58] Field of Search .................... 365/230.06, 230.08, 365/233, 194; 326/105, 106

[56] References Cited

U.S. PATENT DOCUMENTS

| | | |
|---|---|---|
| 4,156,291 | 5/1979 | Baker. |
| 4,916,668 | 4/1990 | Matsui. |
| 4,984,215 | 1/1991 | Ushida. |

FOREIGN PATENT DOCUMENTS

0533096  3/1993  European Pat. Off. .......... 365/230.06

*Primary Examiner*—David C. Nelms
*Assistant Examiner*—Huan Hoang
*Attorney, Agent, or Firm*—Barnes, Kisselle, Raisch, Choate, Whittemore & Hulbert, P.C.

[57] ABSTRACT

An address decoder having non-overlapping word line enable is disclosed having a dynamic logic gate-based decoding section. The decoder includes a deadtime signal generator that produces a pulse at the rising edge of every input clock cycle. The decoder further includes a transmission gate responsive to the deadtime signal for selectively passing the decoder section output signal to a latch. The decoder further includes a NOR logic having an output for coupling to a memory word line which is gated by the deadtime signal to disable the output while the transmission gate passes the decoder output to the latch. When the deadtime pulse transitions to a low state, the latch captures the decoder output signal and enables the output of the NOR gate.

16 Claims, 13 Drawing Sheets

FIG.5

STATIC RANDOM ACCESS MEMORY DYNAMIC ADDRESS DECODER WITH NON-OVERLAP WORD-LINE ENABLE

TECHNICAL FIELD

This invention relates generally to an apparatus for decoding a word address and providing a word-line-enable signal, and more specifically, to a device and method for decoding a memory word address having non-overlapped word-line-enable signals and employing a dynamic logic gate based decoder portion for decoding a word address.

BACKGROUND OF THE INVENTION

Circuitry for accurately and quickly decoding an input word address to generate a word line enable signal has been under investigation for some time. In particular, such investigation has been directed towards very large scale integration (VLSI) memory circuit design, where both high speed, and low area cost become important factors. As background, a static random access memory (SRAM) is internally organized as a memory cell matrix of rows (or words) and columns. In particular, each SRAM memory cell stores a single bit of information, and associated with that memory cell is a word select or enable line, and a "bit line." In practice, the "bit line" comprises a pair of lines, one having a signal which is the complement of the other. To access the information in the memory cell, a high-voltage is typically applied to a desired word line and the bit line corresponding to the desired column is then accessed. To provide access to the entire memory cell matrix, a memory address externally applied to the device is generally translated into a corresponding row or word address, and a column address. The present invention relates to the means by which the row memory address is translated to provide a word select or enable signal, which is applied to the memory cell matrix for access thereto.

When a high-voltage is applied to a word line, the word line is selected or enabled, and all the SRAM memory cells tied to that word line (i.e., all the memory cells in the selected row) are then available for either read or write operations (i.e., it is said that these cells are enabled and their corresponding bit lines are available for access).

In either a read or write operation, no more than one SRAM cell connected to the same bit line may be simultaneously enabled. When this condition occurs, the so-called "interference" created thereby will create an error, since not more than one memory cell output can exist simultaneously on the same bit line. To avoid producing this kind of interference, two or more word lines must never be active-high simultaneously, or, in other words, there must never be the time overlap between multiple word enable lines.

As the operating speed of prior decoder systems increased, a problem arose: a condition was ultimately reached in which the trailing edge transition of a word line that is turning off overlapped the leading transition of another word line which was turning on. There has been some progress towards solving this problem. In particular, one prior system has addressed this problem by disabling the decoder output (i.e., the word line outputs to the memory cell matrix) while the input memory address is sampled by the decoder (i.e., the cause of the problem there being the delay in generating complement bits of the true address bits. However, the prior art solutions do not adequately address problems arising from delays in the decoder circuitry downstream.

Moreover, even on those prior systems having a word line disable feature, the static logic associated with the decoding portion of the decoder provide non-satisfactory performance with respect to operating speed, and further, incur a large area cost when implemented in a VLSI memory circuit designs.

Accordingly, there is a need to provide an improved SRAM memory word address decoder that minimizes or eliminates one or more of the problems as set forth above.

SUMMARY OF THE INVENTION

This invention provides for high speed/relatively low area cost address decoding and having a feature wherein word lines are precluded from overlapping in time. In general, this invention is for use with memory systems of the type having a plurality of the word enable lines, and includes four basic functional blocks. The invention includes a decoder means coupled to a preselected combination of true and complemented address data bits for generating an output signal in response to the preselected combination and deadtime signal generating means responsive to an input clock for generating a deadtime signal. The deadtime signal has an active state and an inactive state. Further, a track and latch means coupled to the decoder means is provided for tracking the decoder output signal when the deadtime signal is active. As the deadtime signal transitions to the inactive state, the track and latch means latches and outputs the decoder output signal. Finally, switching means responsive to the output of the track and latch means and having an output for coupling to one of the word enable lines, is provided in the invention for preventing enablement of the word enable line when the deadtime signal is in the active state. Further, the switching means is further provided for enabling the word enable line of the memory when the deadtime signal has transitioned to the inactive state. The present invention provides substantially better control of the word enable lines than prior art systems insofar as the word enable lines are not enabled by the inventive address decoder until after all of the decoder output signals are latched.

A further problem with prior art memory word address decoders relates to their use of static logic gates in the memory word address decoding section of the decoder. Accordingly, in a further aspect of the present invention, a dynamic logic gate-based decoding section is included in a preferred embodiment of the present invention. The above-mentioned input clock signal is of the type having a first or logic low state, and a second or logic high state. The decoder means includes a precharge means responsive to the first state of the input clock signal for charging a decoder output node to generate the decoder output signal, and multiple input switches coupled to the decoder output node for selectively maintaining the decoder output signal in response to the preselected combination of true and complemented address data bits when an evaluation means, responsive to the second state of the input clock signal, is active.

In a further aspect of the present invention, a method of decoding a memory word address having non-overlap word line enable is provided for use in a memory system of the type having a plurality of word enable lines. This method includes five basic steps. The first step involves decoding the memory word address to generate word line signals wherein each word line signal has an active state and an inactive state. Next, a deadtime signal is generated using an input clock signal. The third step involves preventing enablement of the word enable lines while tracking the respective states of the word line signals using the deadtime signal to thereby prevent two or more word enable lines from being enabled simultaneously. The fourth step involves latching the states of each word line signal using the deadtime signal. Finally, the method includes the step of enabling a selected word enable line using the latched word line signals.

The present invention provides a structure and method for a SRAM dynamic address decoder with non-overlap word/line/enable to provide greater control in the activation or selection of a memory word enable line, while providing the benefits of a dynamic logic gate-based decoding section, including higher speed operation and lower area costs than conventional static logic gate-based decoding section, as well as reduced power dissipation.

These and other objects of the present invention will be apparent to those skilled in the art from the following specification and claims, making reference to the appended drawings of which the following is a brief description.

DETAILED DESCRIPTION OF THE PREFERRED EMBODIMENT

Before preceding to a description of the present invention, the physical environment in which the following circuitry is actually implemented will be described. Particularly, the following description of the present invention is with reference to United Micro Electronics Corporation (UMC) 0.8 μm DPDM process, specification number 011-503-NC5-MAA, hereby incorporated by reference. In particular, for the components herein to be described, certain defined parameters associated with the described component will be identified (e.g., l=0.8 μm, w=2. μm). It should be understood that the following design parameters may be scaled downwardly or upwardly if a smaller or larger physical design process (e.g., l=0.6 μm) becomes available. The description of these parameters is exemplary only and does not limit the present invention, but is merely recited to provide a full and complete description thereof.

Figure 1:
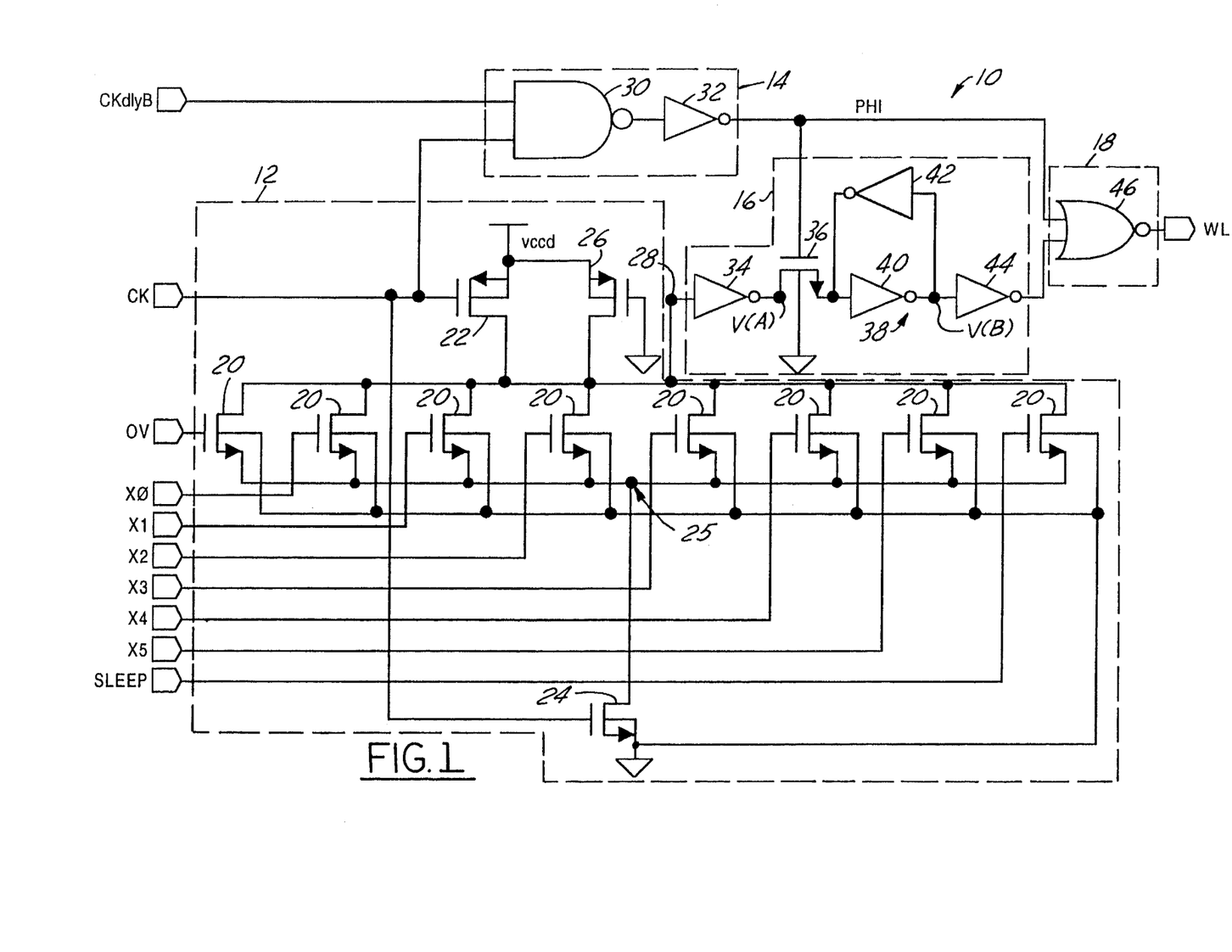
FIG. 1 is a partial schematic view of a modular design cell embodiment of the present invention for enabling one memory word line, and including a dynamic logic gate-based decoder means, a deadtime signal generating means, and a switching means responsive to the deadtime signal for disabling the cell output.

Referring now to the drawings wherein like reference numerals are used to reference identical components in various views, FIG. 1 shows a SRAM dynamic address decoder circuit cell 10 employing a dynamic logic gate-based decoder means 12, a deadtime generator means 14, a track and latch means 16, and switching means 18.

Cell 10 is preferably adapted for use with a memory system of the type having a plurality of word select or word enable lines. Further, cell 10 is provided with various input signals and also outputs a signal, these signals being described briefly below. Signal CK is an input clock signal. Signal CKdlyB is signal CK which is delayed and inverted. Signal 0 V is a pixel overlay enabling signal. When signal 0V=logic high, the pixel overlay memory is selected. When 0V=logic low, the pixel overlay memory is not selected,— which non-selection is considered the normal mode.

The SLEEP signal is a sleep mode enable signal, which when SLEEP=logic high, sets all the word lines to a logic low (disabled), and thus all the memory cells in the SRAM are thereby inaccessible. Signals X0–X5 represent a preselected combination of true and complemented memory word address data bits. Signal WL is the word line select output of cell 10. The WL signal is preferably active-high; accordingly, when WL=logic high, the word line (and thus all memory cells) in the SRAM cell matrix to which it is connected becomes enabled.

Decoder means 12 is coupled to input X0–X5 (i.e., the preselected combination of true and complemented address data bits) and is provided in cell 10 for generating an output signal (which is preferably a logic high) in response to the preselected combination (which may be when X0–X5= [000000]. The deadtime signal generating means 14 is responsive to the CK, and CEdlyB signals and is provided for generating a deadtime signal PHI. The signal PHI has an active state (logic high) and an inactive state (logic low). Track and latch means 16 is coupled to decoder means 12 and is provided for tracking the decoder output signal when PHI is logic high and for latching and outputting the decoder output signal as PHI transitions to the inactive state (logic low).

The switching means 18 is responsive to the track and latch means 16 output and PHI, and has an output for coupling to one of the word enable lines of the memory cell matrix, and for disabling the word enable lines when PHI is active (logic high). Switching means 18 also is provided in cell 10 for enabling the word enable line (signal WL) when PHI has transitioned to an inactive state (logic low).

The decoder means 12 is preferably dynamic logic gate-based; that is, the operation of decoder means 12 is associated with a clock control provided by signal CK. It should be understood that the nonoverlap features of the present invention do not depend on decoder means 12 being based on dynamic logic gates; accordingly, the nonoverlap word line enable aspect may still be obtained using more conventional static logic gates. The operation of decoder means 12 occurs in two phases to systematically provide logic functions: (1) a precharge phase, and (2) an evaluation phase. Signal CK is used to distinguish between these two phases; when CK is in a first state (logic low) the precharge phase occurs, while when CK transitions to a second state (a logic high), the evaluation phase begins.

Decoder means 12 includes input logic switches 20 (1 =0.8 μm, w=2 μm), a precharge means, preferably transistor switch 22 (l=0.8 μm, w=10 μm), an evaluation means, preferably transistor switch 24 (l=0.8 μm, w=5 μm), and a pull-up means, preferably transistor switch 26 (l=15 μm, w=1 μm). Decoder means 12 further includes a decoder output node 28.

In a preferred embodiment, precharge switch 22 and evaluation switch 24 are complementary MOSFETs, and are clock controlled by signal CK. A clock state of CK=logic low initiates the precharge phase by placing precharge MOSFET switch 22 in a conduction mode while maintaining evaluation MOSFET switch 24 in cutoff. Current flow is then established from a power source (VCCD) through switch 22 to precharge the output capacitance $C_{out}$ (not illustrated) of node 28 to a value equal to that of the power supply (VDD). The evaluation phase occurs when CK=logic high. Switch 22 is now in cutoff (maintaining isolation of the power source from any path to ground, for example, through switches 20 and 24), while evaluation switch 24 is placed in a conduction mode. Conditional discharge of the capacitance $C_{out}$ of node 28 occurs in accordance with the values of the preselected combination of true and complemented memory word address bits, represented as signals X0–X5. If X0–X5 are low (the input signals 0V, and SLEEP are assumed be in a logic low state during normal operation), each of the switches 20 are in cutoff and therefore do not conduct; accordingly, the voltage at node 28 remains at the precharged, logic high level (VDD). Conversely, a logic high signal on any one of X0–X5 will cause the respective input logic switches 20 to be placed into a conduction mode, thus providing a discharge path for the charge on node 28 and thus resulting in a logic low voltage at node 28.

It should be appreciated by those of ordinary skill in the art that since the operation of decoder means 12 depends on storing a charge on node 28, static or low frequency operation is difficult to obtain because of charge leakage problems associated with devices of this type. This problem is overcome by decoder means 12 by including pull up switch 26, used as a resistor, which connects node 28 to the above-mentioned power source. Conduction of switch 26 supplies current to node 28 to maintain the node voltage at a logic high (=VDD). It should be understood that since, as a resistor, the selected size ratio (w/l) for pull up switch 26 is chosen to be small so as to keep the direct current (DC) power dissipation to a minimum.

Figure 6:
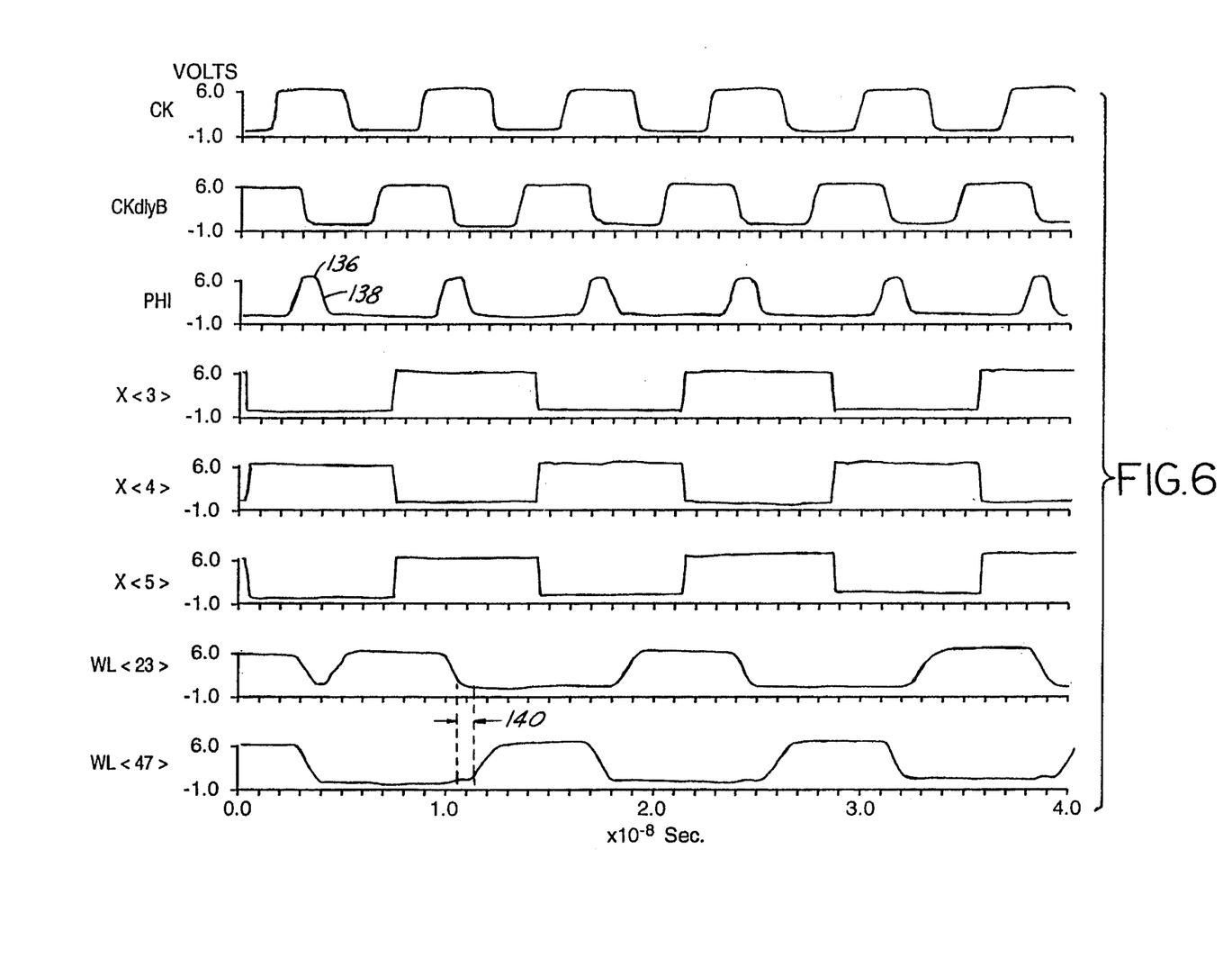
FIG. 6 is a timing chart diagram showing the operation of the 64-line decoder embodiment of the present invention as employed in the test circuit of FIG. 5, particularly demonstrating the word line non-overlap effect.

The dynamic logic gate based decoder means 12, in contrast to a static logic gate based decoder means found in prior systems, has at least two important advantages thereover. First, since precharge switch 22, and evaluation switch 24, operate in respective states of signal CK, there is never a direct current path from the power source (Vccd) to ground; accordingly, the power dissipation for this configuration is very low. It should be appreciated that in high-speed operation, pull up switch 26 is always effectively removed so there is never a direct current path from VDD to ground. Further, the size ratio W/L of switch 26 is so small that its power consumption, even when on, is correspondingly low. Second, the speed of operation of decoder 12 is considerably enhanced, for the following reasons: first, because of the precharge of node 28 to a logic high, if the decoder output signal should, based on the input signals at X0–X5, be a logic high then there is minimal, if any, delay since node 28 is already precharged to a logic high level. Conversely, when the decoder 12 output signal should be, based on inputs X0–X5, a logic low, enhanced speed operation is also observed. It should be understood that the inputs X0–X5 to switches 20 occur or are available at a time earlier than the rising edge of clock CK, as illustrated in FIG. 6. Thus, the stored charge on node 28 ($C_{out}$) will begin leaking into node 25 prior to the above-described evaluation phase (i.e., the evaluation phase begins with the rising edge of signal CK when evaluation switch 24 is placed in a conduction mode) through the selected (i.e., conducting) switches 20. It is this pre-leaking action that assists in the discharge of the output capacitance of node 28 ($C_{out}$) when in the evaluation phase.

In general terms, then there is only one switch 24 to discharge through in the best case; while, in the worst case, there are two switches (20 and 24) to pass through. It should be appreciated from the foregoing that the decoding capability of dynamic gates is faster than a corresponding decoder formed of conventional static gates. Moreover, as an added benefit, the area usage for the dynamic logic gate-based decoder 12 is superior (i.e., uses less area), than a static logic gate based decoder.

Deadtime signal generating means 14 performs a conjunctive function and may include, a two-input NAND gate 30 (wp=6 u; wn=3 u), and an inverter 32 (wn=5 u; wp=15.5). Signals CK and CKdlyB are provided as inputs to NAND gate 30. Signal CK is provided external to cell 10. Signal CKdlyB, as shown by the circuit in the dashed line box in FIG. 4D, may be generated by passing signal CK through a series of five NOT or inverter gates.

Track and latch means 16 is coupled to decoder means 12 (via node 28) and includes buffer gate 34, which may be an inverter 34 (wn=7 u; wp=21.8 u), transmission gate 36, preferably NMOS switch 36 (L=0.8 u; W=10 u), and latch 38. Preferably, latch 38 comprises inverter 40 (wn=4 u, wp=12.4 u), inverter 42 (L=1 u; wn=0.8 u; wp=2.3 u), and inverter 44 (wn=5 u; wp=15.5 u). Inverter 34, and inverter 44 function as buffers—the inverting logic of each gate cancelling out when analyzed from the input of the means 16 to the output of means 16. Switch 36 is controlled by deadtime signal PHI. So long as PHI remains in the high state, switch 36 will pass or transmit the voltage appearing at node V(A). Latch 38 will track the transmitted voltage; accordingly, when PHI=logic high, node voltage V(B) will track V(A). Voltage V(B) is latched to a fixed value and stored by latch 38 after PHI transitions to a low logic state. It should be appreciated that functionally, the combination of switch 36 and latch 38 effectively constitutes a digital track and latch circuit, wherein the decoder output signal appearing on node 28 is tracked by track and latch means 16 to appear at node V(B) while PHI is a logic high, and further to latch the decoder output signal as PHI transitions to a logic low state. The latch 38 stores and outputs the decoder output signal (more accurately, its complement) via inverter 44.

Switching means 18 comprises a two-input NOR gate 46 (wp=40 u; wn=12 u). It should be appreciated that the size of the NOR gate 46 determines, in part, its driving capability, and, accordingly, its load handling capacity. It should be appreciated that while track and latch means 16 is tracking decoder output signal from node 28 when PHI is high, the high logic state of PHI maintains the output of NOR gate 46 in a logic low state, which disables the word line to which it is connected. After the decoder output signal has been latched due to the trailing edge of PHI, the low logic state of PHI permits the decoder output signal held in track and latch means 16 to be transmitted to word line WL. It should be appreciated that the operation of latch 38 relative to the release of NOR gate 46, provides better control over the WL signals than in prior systems; particularly, the NOR gate 46 assures that all WL signals will begin changing at the same time, even if multiple latches 38 (for multi-word line decoders employing multiple cells 10) change at different speeds.

Figure 2A:
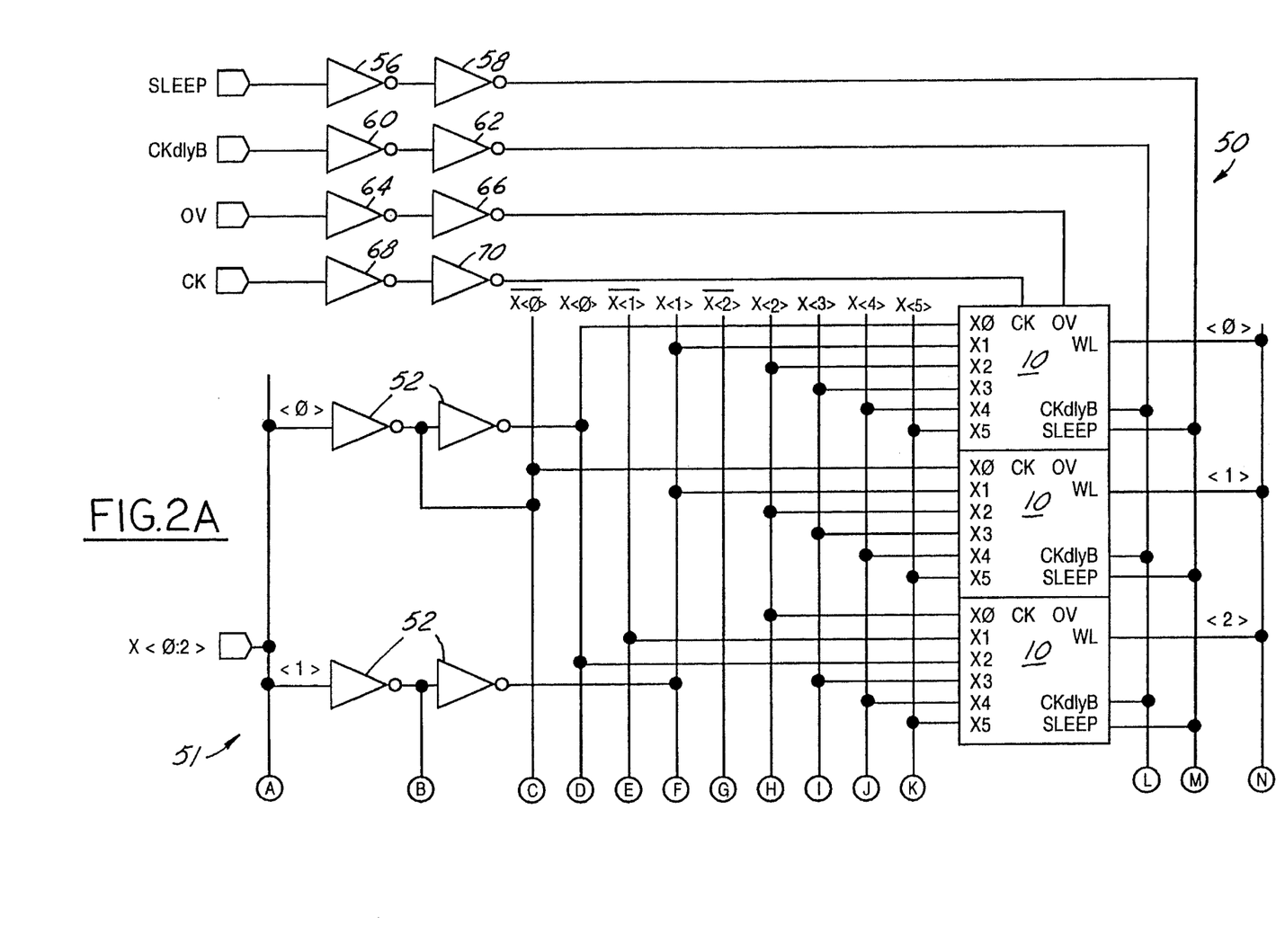
FIGS. 2A and 2B are a partial schematic diagram of an 8-word line decoder embodiment of the present invention employing eight of the modular cells shown in FIG. 1.
Figure 2B:
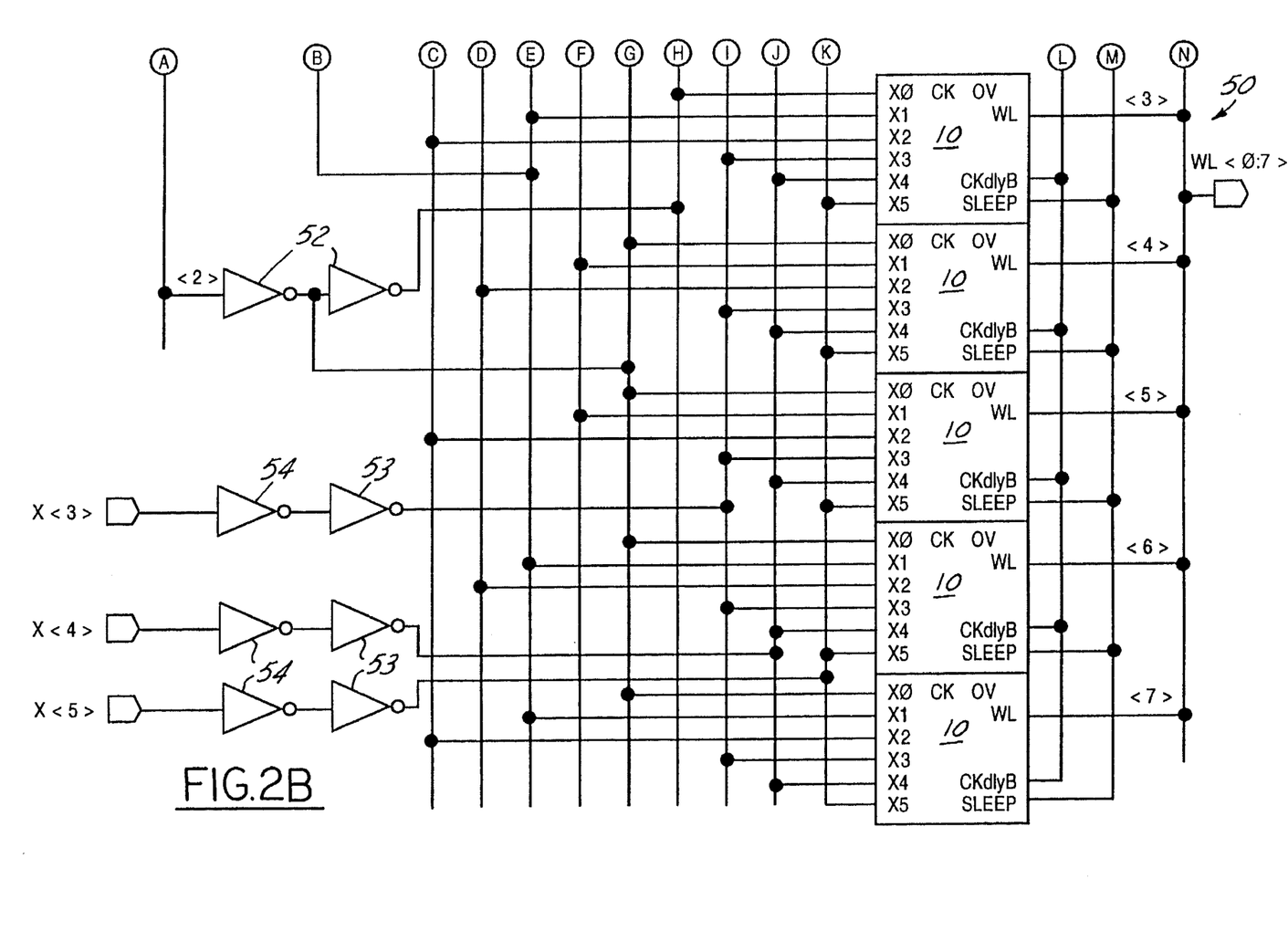

Referring to FIGS. 2A–2B, an 8 word line address decoder 50 includes, preferably, 8 cells 10, each cell having an output for enabling a respective one of the word enable or select lines of memory, and logic circuitry 51 responsive to a memory word address, X<0:5>, for producing a plurality of preselected combinations of true and complemented address bits. Each cell 10 of decoder 50 is provided with a respective one of the preselected combinations produced by logic circuitry 51. It should be appreciated that logic circuitry 51, via appropriate cross connection, provides the means for translating an input memory word address to a desired cell input X0–X5.

Logic circuitry 51 includes inverters 52 (wp=15.5 u; wn=5 u), inverters 53 (wn=8 u; wp=25 u), and inverters 54 (wn=3.2 u; wp=9.8 u). The SLEEP signal is buffered via inverters 56 (wp=6 u; wn=2 u), and 58 (wp=15.5 u; wn=5 u). Signal CKdlyB is buffered by inverters 60 (wp=9.8 u; wn=3.2 u), and 62 (wp=21.8 u; wn=7 u). Signal 0 V is buffered by inverters 64 (wp=6 u; wn=2 u), and 66 (wp=15.8 u; wn=5 u). Clock signal CK is buffered by inverters 68 (wp=14.2 u; wn=4 u), and 70 (wp=47 u; wn=15 u).

This 8 word line decoder embodiment of the present invention may be employed in yet larger word-line embodiments, as described below.

Figure 3A:
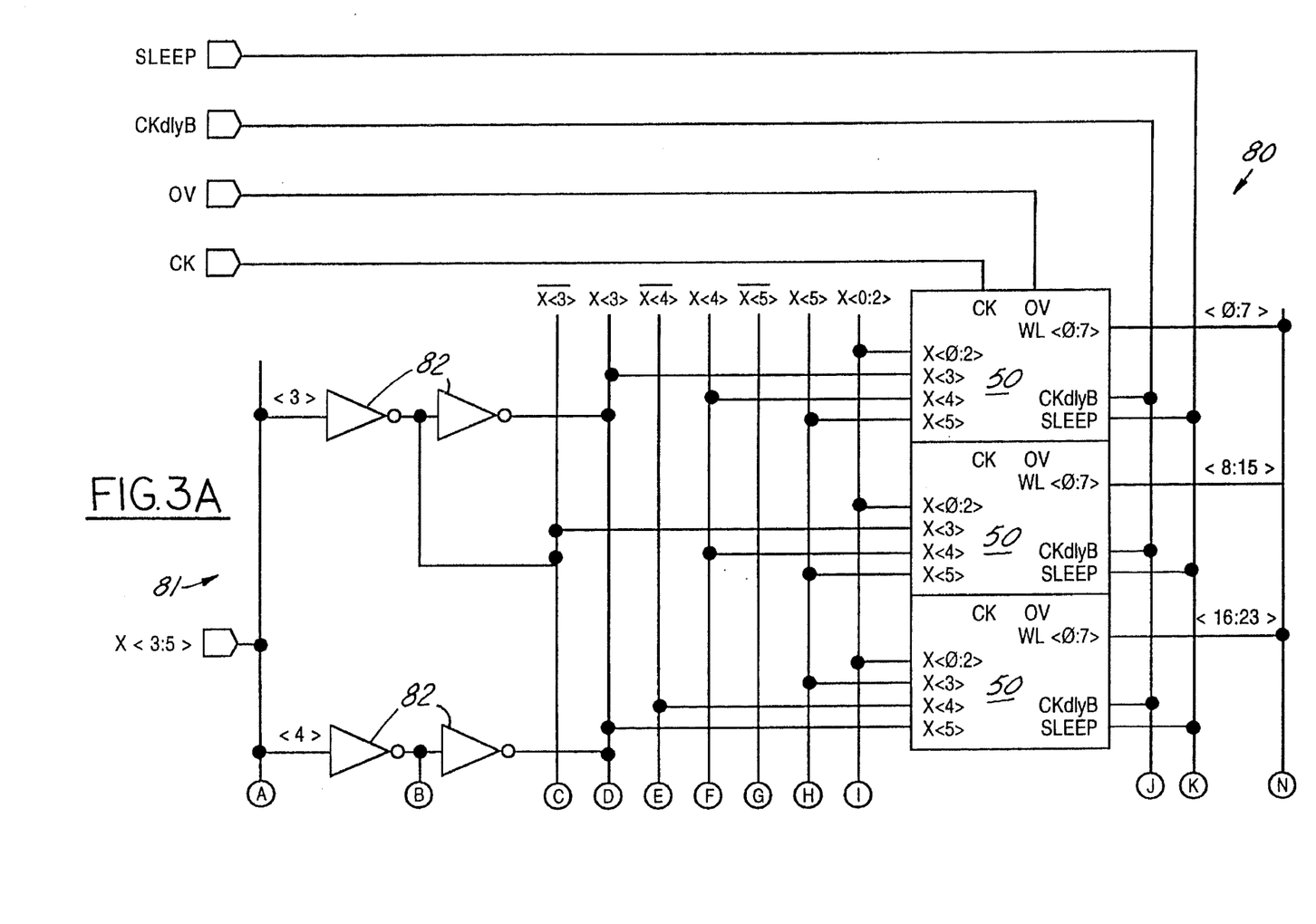
FIGS. 3A and 3B are a partial schematic view of a 64-line decoder embodiment of the present invention employing eight of the 8-line decoders shown in FIGS. 2A–2B.
Figure 3B:
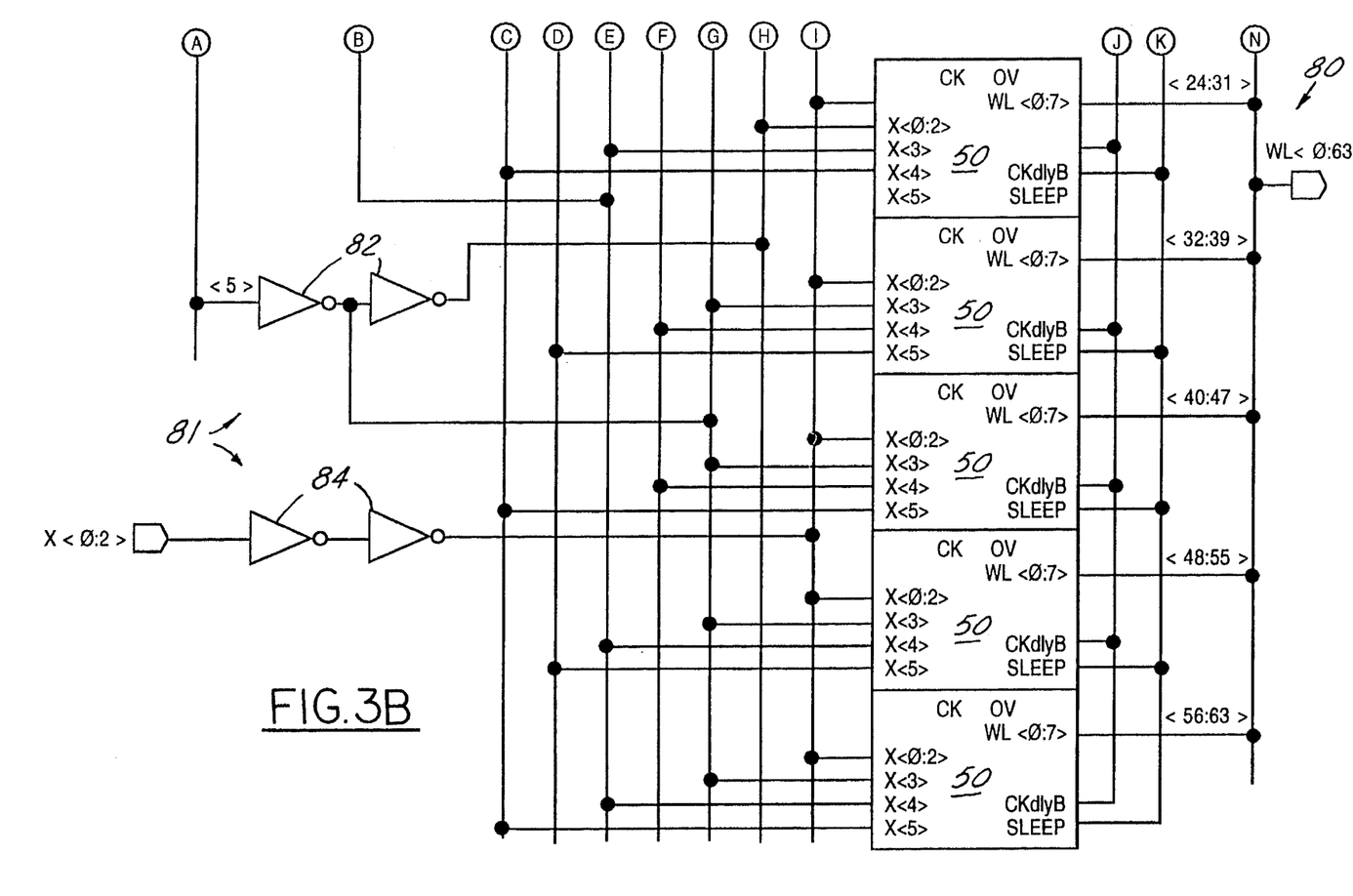

Referring now to FIGS. 3A–3B, 64 word-line decoder 80 includes, preferably, eight 8 word line decoders 50, and logic circuitry 81, which is provided in decoder 80 for producing a plurality of preselected combinations of true and complemented memory word address bits. Logic circuitry 81 includes inverters 82 (wp=15.5 u; wn=5 u), 84 (wp=9.8 u; wn=3.2 u), and 86 (wp=25 u; wn=8 u). It should be appreciated by those of ordinary skill in the art that decoder 80 can decode a 6 bit address data into 64-word lines. It should be appreciated that the address bit length is exemplary only, and not limiting in nature; for example, the decoder module 102 shown in FIG. 4A just uses two-bit inputs, so there are 4 output word lines coupled therefrom.

Referring now to FIGS. 4A–4F, 64 word-line decoder 80 is advantageously employed in a memory system 100.

System 100 includes an equalizer-top equiT4, a 64 word by 4 bit memory M64X4, a 4 word by 4 bit memory M4X4, an equalizer-bottom squiB4, a column decoder YDEC, row decoders 80, 102, sense amplifier SAMP, DC voltage bias module Vbias, and a read/write control module RWcnt1.

Figure 4A:
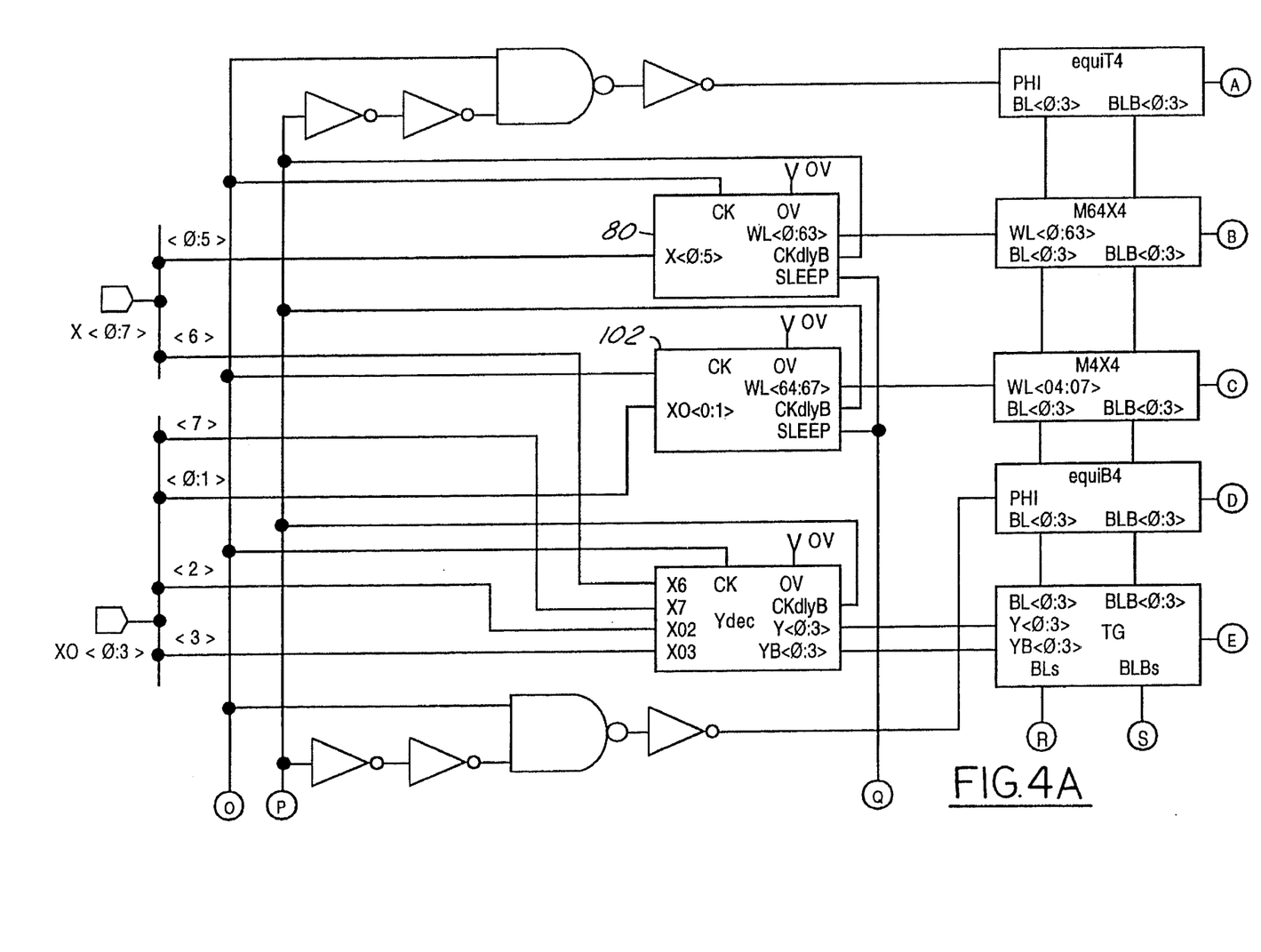
FIGS. 4A–4F are a partial schematic diagram of a memory bank employing the 64-line decoder shown in FIGS. 3A–3B.
Figure 4B:
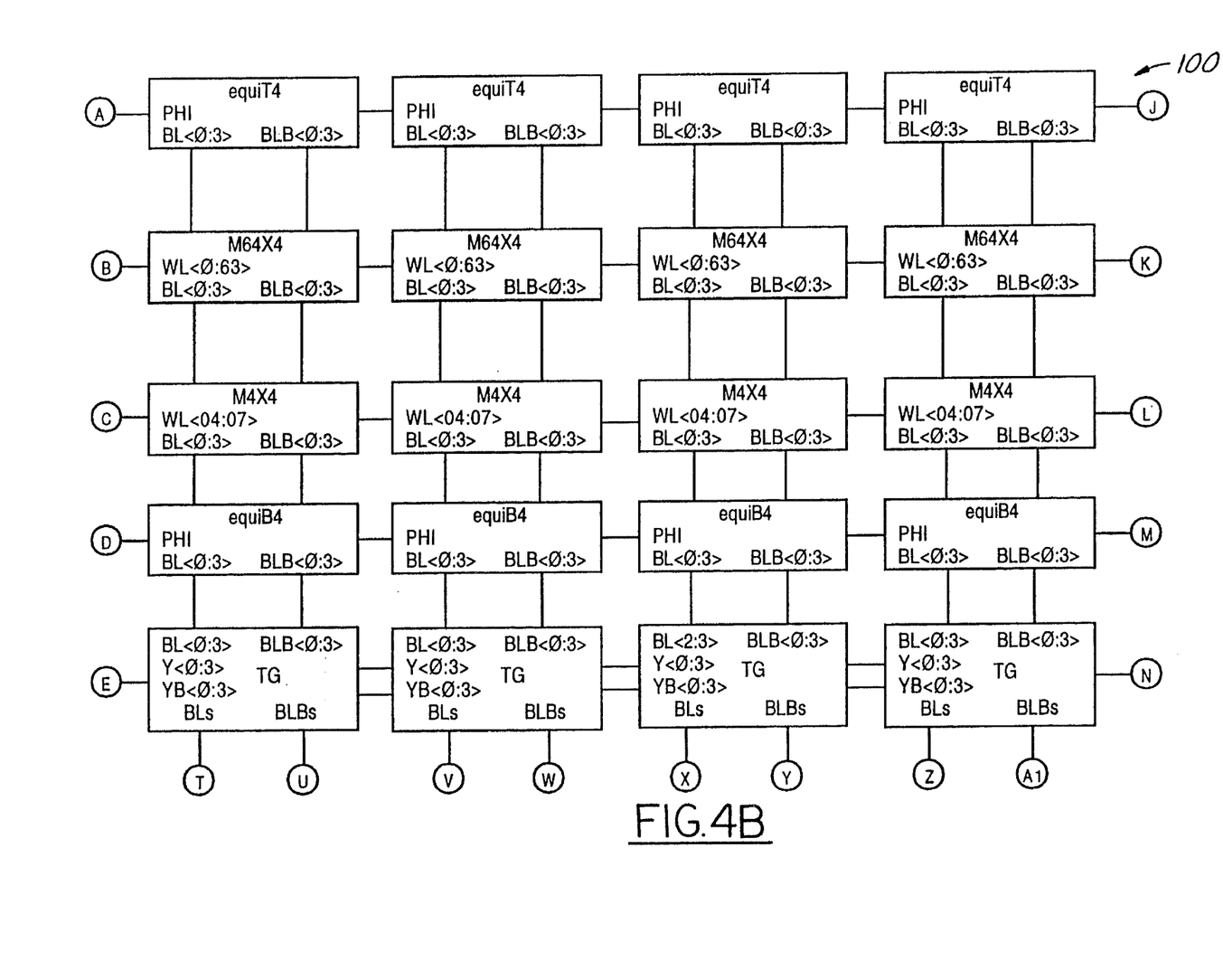
Figure 4C:
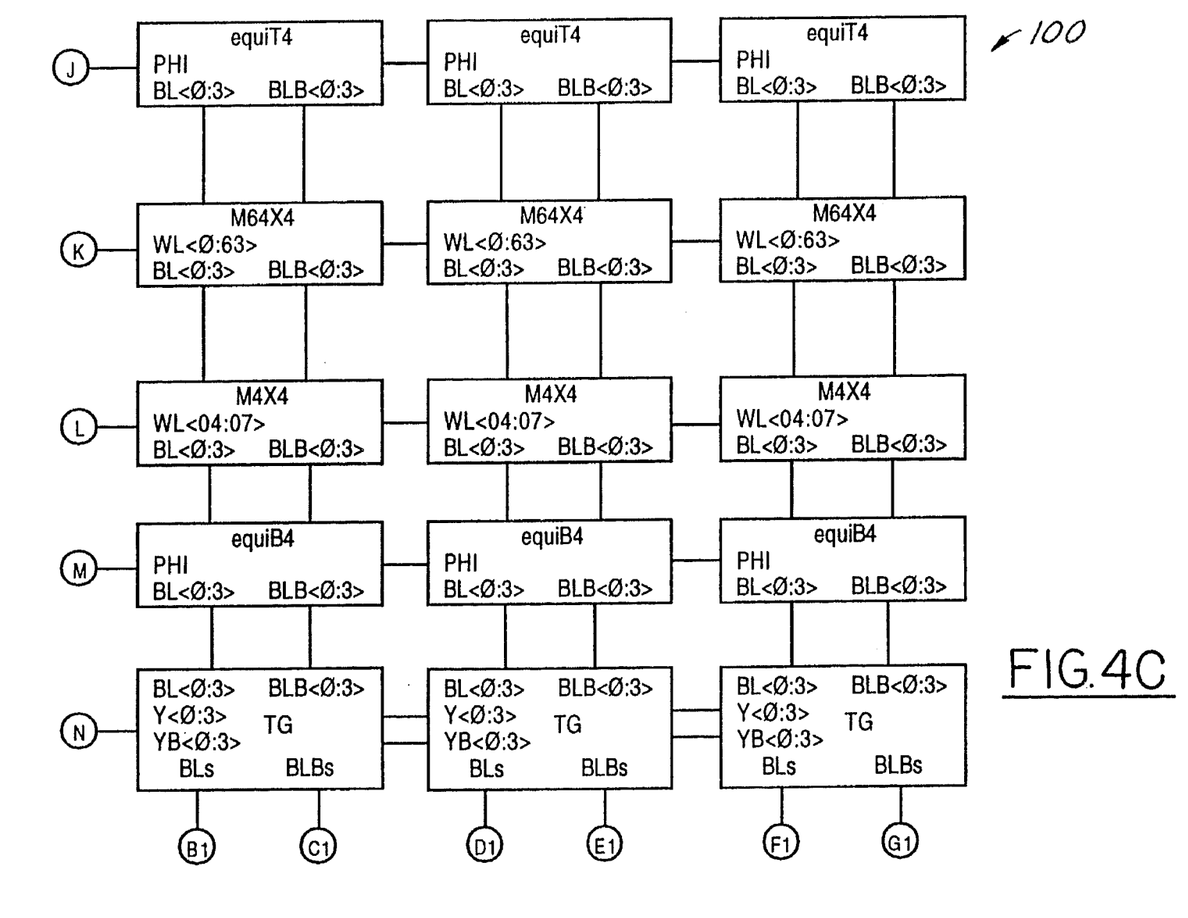

It should be understood from FIGS. 4A, 4B, and 4C that a PHI signal is coupled to respective inputs on each equiT4; another PHI signal generated from separate circuitry is coupled to respective inputs on each squiB4; the WL<0:63> signal from word line decoder 80 is coupled to respective inputs on each memory M64X4; the WL<64:67> signal from word line decoder 102 is coupled to respective inputs on each memory M4X4; and signals Y<0:3> and YB<0:3> from YDEC are coupled to respective Y and YB inputs on each transmission gate TG.

Figure 4D:
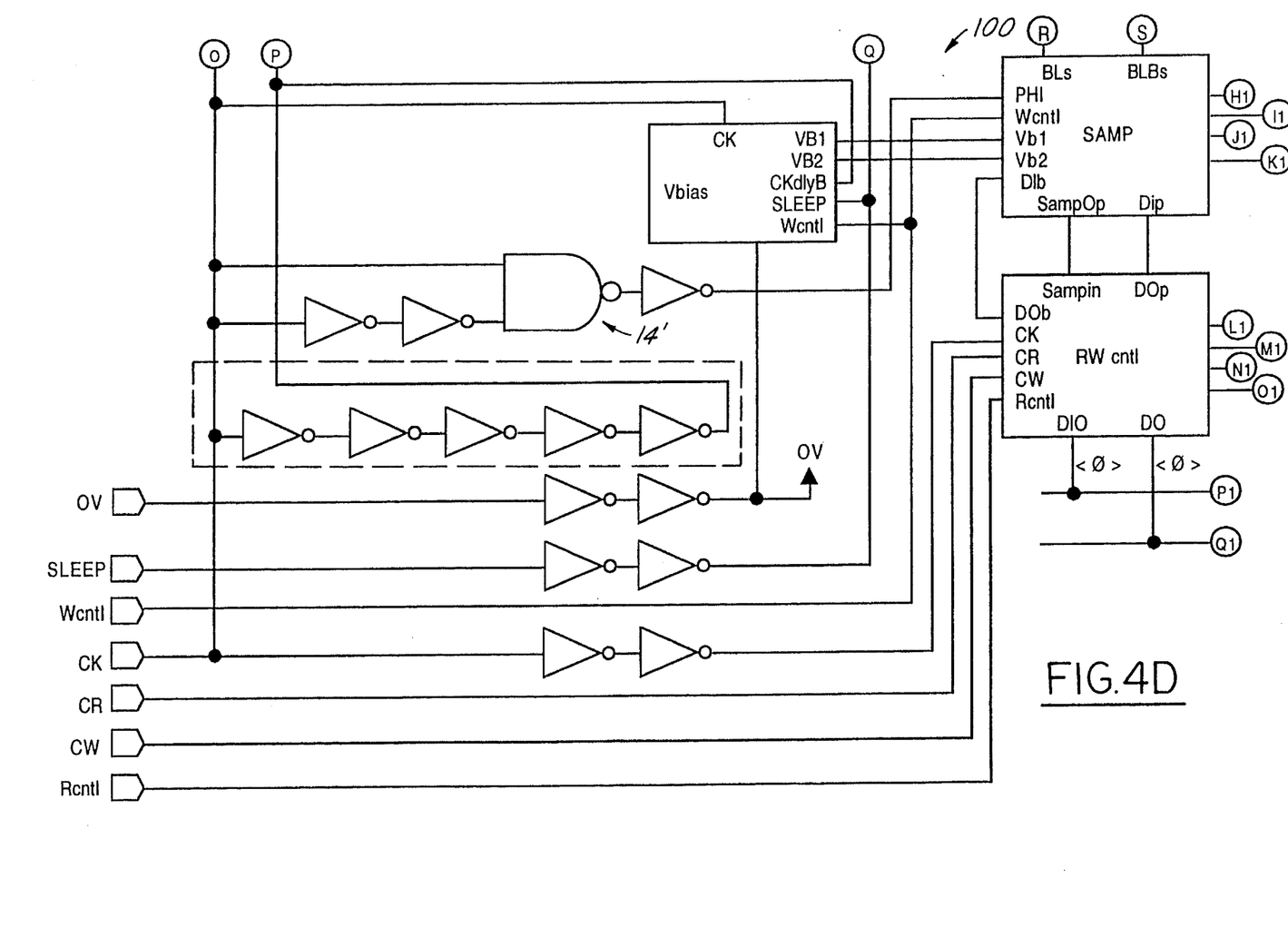
Figure 4E:
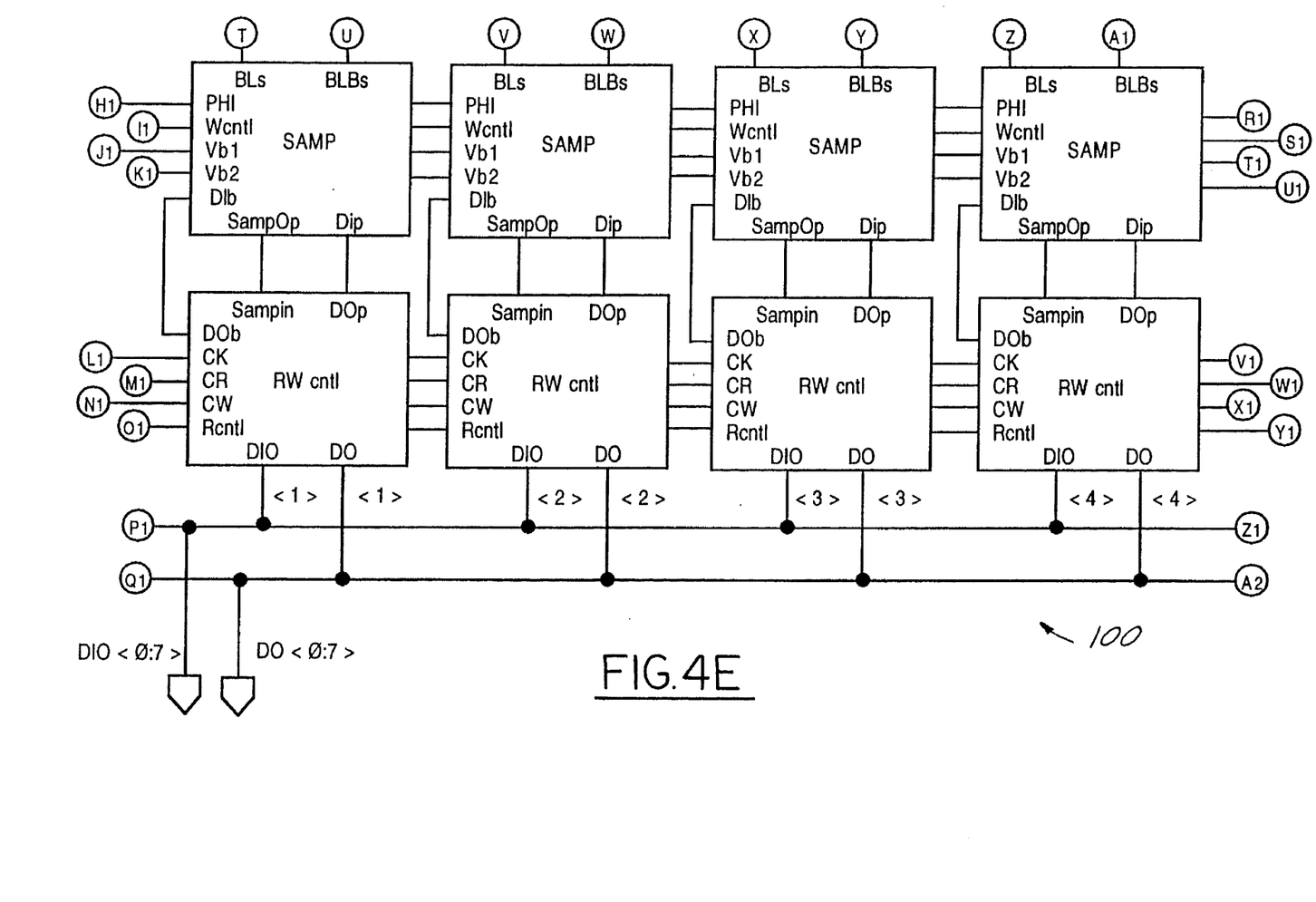
Figure 4F:
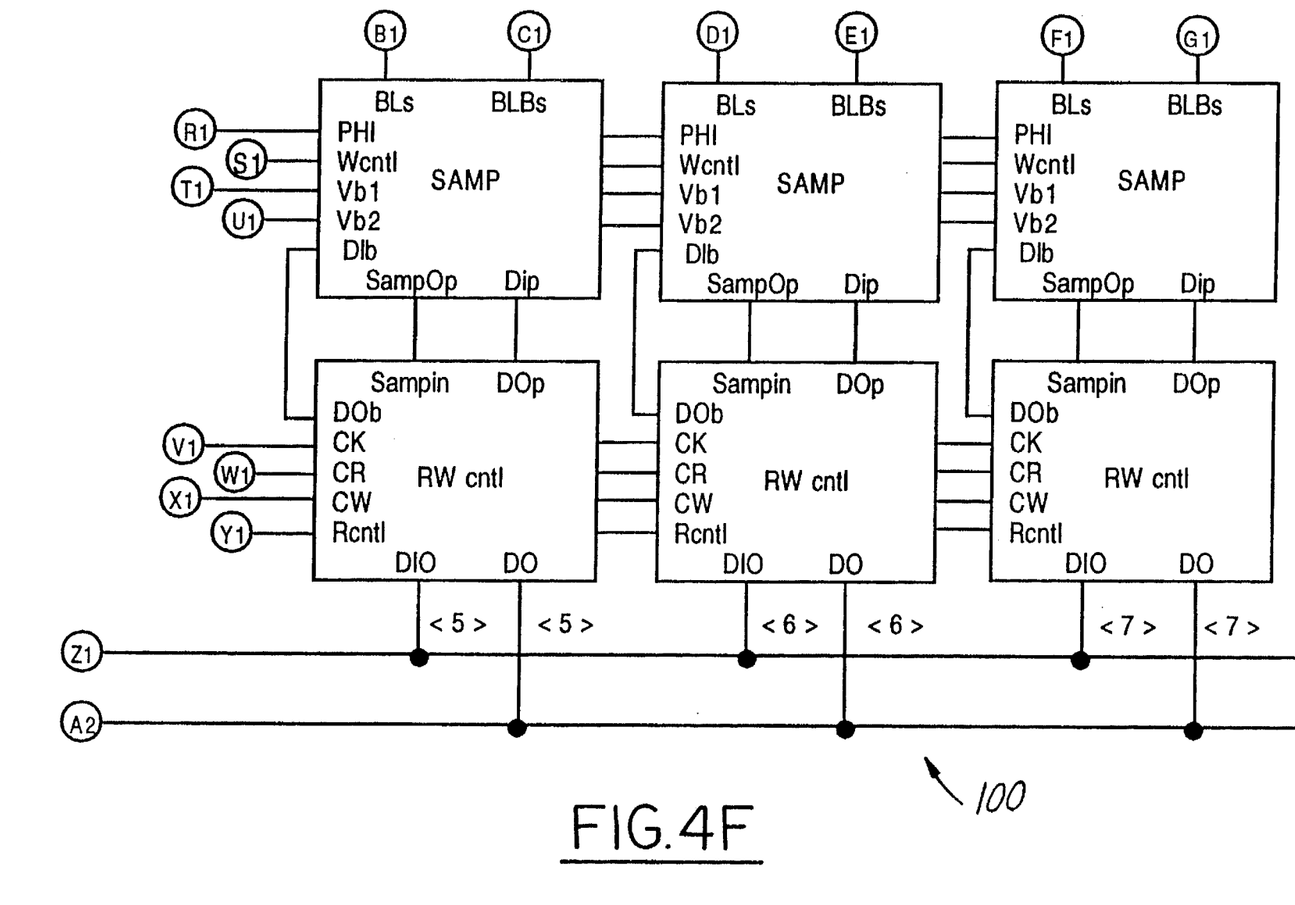

It should further be understood from FIGS. 4D, 4E, and 4F that another PHI signal (generated from deadtime generator 14'), input signal Wcnt1, and signals Vb1, Vb2 from Vbias are coupled to respective PHI, Wcnt1, Vb1, and Vb2 inputs on each sense amplifier module SAMP; and input signals CK, CR, CW, and Rcnt1 are coupled to respective inputs on each read/write control module RWcnt1.

Moreover, it should be understood from FIGS. 4A–4F that each of the eight columns of memory 100 respectively comprising equiT4, M64X4, M4X4, squiB4, and SAMP has associated therewith four bit line pair busses BL<0:3> and BLB<0:3>. Respective inputs BL<0:3> and BLB<0:3> on each module equiT4, M64X4, M4X4, squiB4, and SAMP are coupled to the bit line pair busses.

Referring to FIG. 4A, equalizer circuit module equiT4 preferably includes 4 equalizer subcircuits. Since module equiT4 is placed at the top of the circuit layout of the memory system 100, the symbolic name equiT4 is used for it. As background for describing equiT4, a conventional memory cell has one bit of data stored therein, one word-line-enable input, and two lines of complementary bit lines as outputs. When the word line input is enabled, the memory cell can exchange (i.e., read/write) a data bit with the external world by means of this pair of complementary bit lines. Frequently, it may happen that, between two successive read and/or write operations, the polarity of the data bit accessed in the previous operation is different from the polarity of the data bit accessed in the following operation (i.e., the previous data bit is a logic high, while the following is a logic low and vice-versa). The different polarity induces a large voltage swing on the data bit line, which prolongs or extends the read/write operation. To solve this problem, a small interval of time between two successive read/write operations is used to effect a charge balance operation through the use of the different polarities existing on the two complementary bit lines, and a controlled switched. The controlled switch implements a so-called equilization operation. The equilizer (i.e., switch) under control provides a conduction path between the two complementary bit lines which then push/pull the extreme voltage levels to a neutral level (or balanced level), having a value approximately half way in between the two extremes. The provision of this neutral or balanced level can reduce the time for read/write operations on a memory cell since the voltage swing is not as great. One equalizer can control a pair of bit lines; accordingly, since circuit module equiT4 preferably includes 4 equalizer subcircuits, module equiT4 can control 4 pairs of bit lines. Since the bit lines in the circuit layout are rather lengthy, a corresponding equalizer module squiB4 is provided to speed up the charge balance operation. Thus, equalizer module equiT4 is provided at the top of the circuit layout, while equalizer module squiB4 is provided at the bottom.

Memory submodule M64X4 has 64 multiplied by 4 memory cells, which are arranged in a matrix configuration. M64X4 has 64 word-line-enables inputs, and 4 bit line pairs as outputs. Similarly, M4X4 is also arranged in a matrix type configuration, having 4 word line (row) inputs, and 4 bit line pairs as outputs.

Module YDEC is used as a Y (column) decoder in memory system 100. YDEC has a 2-bit input address (i.e., X<6> and X<7>), and 4 pairs of output control lines which are coupled to the inputs of transmission gate module TG in FIG. 4A. Each transmission gate module TG preferably includes 4 sets of switches, which control the conduction path between the 4 pairs of bit lines (from memory modules M64X4 and M4X4) and a sense amplifier module SAMP.

In FIG. 4B, the sense amplifier module SAMP is used to amplify small signals from the bit line pairs while DC bias module Vbias provides a voltage bias for the amplifying operation. Since the implementation for both the sense amplifier SAMP and the voltage bias module Vbias use dynamic-gate structures, they are also controlled by the input clock CK.

With continued reference to FIG. 4D, the read/write control module RWcnt1 provides a required path through which all read/write data must pass. In a read operation, RWcnt1 module latches the amplified data from the enabled sense amplifier SAMP, and then proceeds to pass it to the outside world (i.e., external data bus). In the write operation, the sense amplifier SAMP is disabled, and the data from the outside world is directly driven onto the selected bit line pairs through the transmission gate switch module TG.

Figure 5:
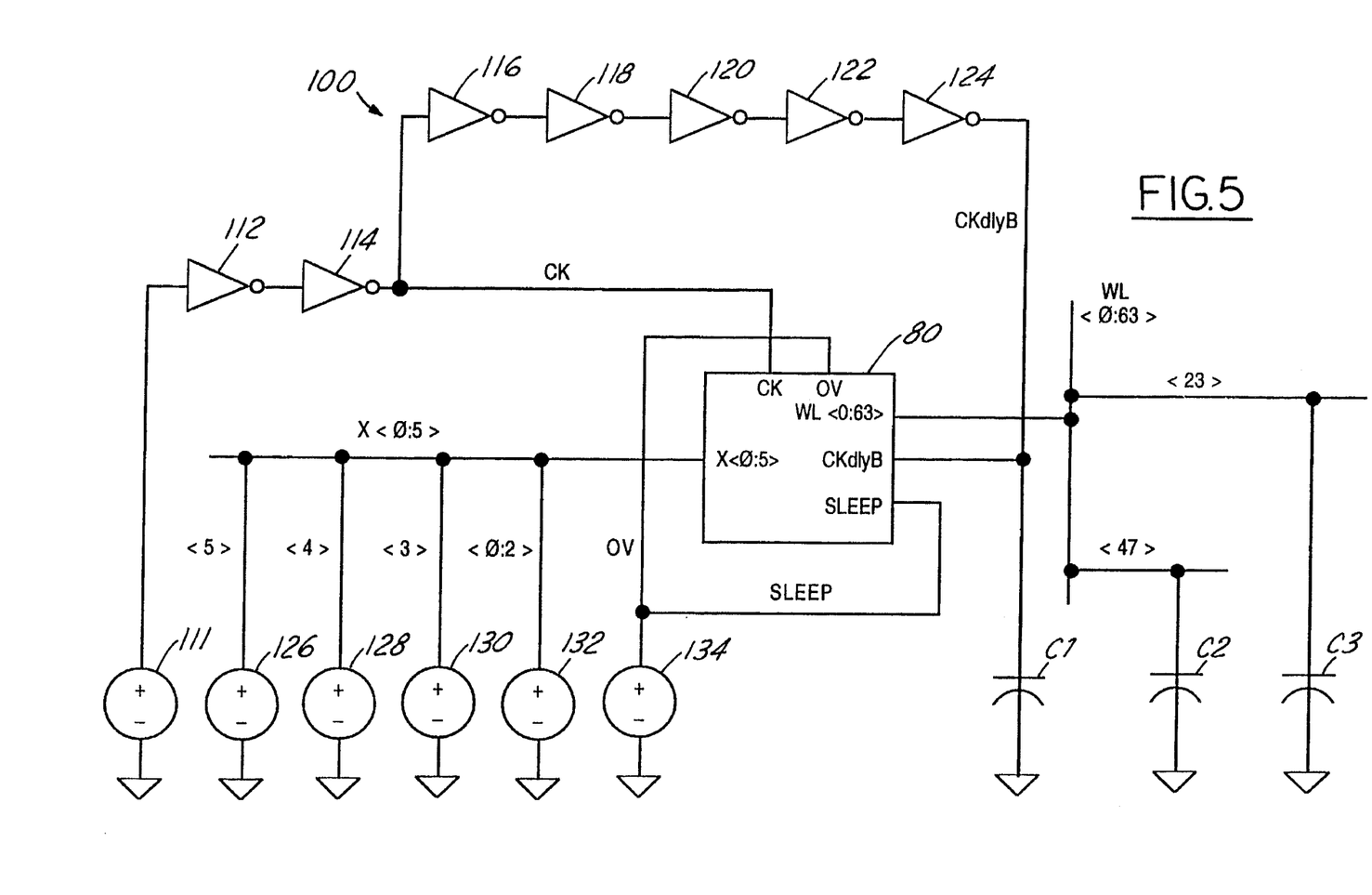
FIG. 5 is a partial schematic view of a test circuit for testing the 64-line address decoder shown in FIGS. 3A–3B.

Referring now to FIG. 5, test circuit 110 is used to observe the decoding capability of a 64-word line decoder 80 (i.e, the device under test) and the word line non-overlap effect. An AC clock source 111 provides a square wave clock signal. The present invention may be clocked by CK having various parameters (frequency, duty cycle, etc.). However, the following description of source 111 is with reference to the timing diagrams shown in FIG. 6, clock source 111 generates a signal having a 7 nanosecond (ns) period, a fifty percent (50%) duty cycle, a rise time (RT) of 0.5 ns and a fall time (FT) equal to 0.5 ns. The generated signal from source 111 is passed through buffer inverters 112 (wn=4 u; wp=12.4 u), and 114 (wn=10 u; wp=31 u) to produce clock signal CK. The CKdlyB signal is produced by passing CK through inverters 116 (L=1 u; wn=0.8 u; wp=2.3 u), 118 (L=1 u; wn=1.2 u; wp=3.5 u), 120 (wn=3 u; wp=9.8 u), 122 (wn=4 u; wp=12.4 u), and 124 (wn=12 u; wp=38 u). Signal generators 126, 128, 130, and 132 correspond to memory word address bits X<5>, X<4>, X<3>, and X<0:2>, respectively. With reference to the timing diagrams of FIG. 6, the respective signal sources 126, 128, 130 and 132 are programmed such that 6 bit address, [X<5> X<4> X<3> X<2> X<2> X<1> X<0>] alternates between [010111]=23 and [101111]=47. The 0 V and SLEEP signals are set to a logic low value (normal). It should be appreciated that inverters 112, 114 introduce a small delay, wherein the input address data transitions from sources 126, 128, 130 and 132 occur approximately one nanosecond before the rising edge of clock signal CK. Capacitors C1, C2, and C3 have values of 0.1 pF, 0.47 pF, and 0.47 pF, respectively.

FIG. 5 shows the timing relationships between the input memory word address X<3:5> and the output word line signals WL<23> and WL<47> from decoder 80. It should be appreciated by one of ordinary skill in the art that decoder 80 includes sixty-four of the modular cells 10. Thus, although there are sixty-four cells 10, for purposes of illustration only, we are interested in the 23rd and 47th cells. The details of the relationship between X<0:5> and X0–X5 (provided as an input to a particular cell 10) should be apparent to one of ordinary skill in the art.

The operation of decoder 80 will now be described. When address [X<5>. . . X<0>]=[010111]=23, [X5 . . . X0]= [00000] will appear at the input of decoder means 12 of the 23rd cell 10. Node voltage V(A) will settle to a logic low before the rising edge of signal CK occurs. Deadtime signal PHI, when a logic high, will cause track and latch means 16, particularly node voltage V(B), to track V(A). This "tracking" interval is shown at 136 in FIG. 6. As deadtime signal PHI transitions to a logic low state, latch 38 operates to capture the value at node V(B). This latching interval is shown at 138 in FIG. 6. Since the latched value is a logic high, this value is passed to the output word line WL<23> after PHI is low. In a similar fashion, if [X<5>. . . X<0>]= [101111]=47, output node WL<47> will settle to a logic high state in the 47th cell 10 of decoder 80 after latch pulse signal PHI occurs. It should be understood that overlap between word line enable signals (e.g., WL<23>, WL<47>) is prohibited by the presence of signal PHI. The non-overlap interval is indicated at 140 in FIG. 6.

The preceding description is exemplary rather than limiting in nature. A preferred embodiment of this invention has been disclosed to enable one skilled in the art to practice this invention. Variations and modifications are possible without departing from the purview and spirit of this invention; the scope of which is limited only by the appended claims.

What is claimed is:

1. An address decoder circuit for use with memory means of the type having a plurality of word enable lines, comprising:

decoder means coupled to a preselected combination of true and complemented address data bits for generating an output signal in response to said preselected combination;

deadtime signal generating means responsive to an input clock signal and a delayed clock signal for generating a deadtime signal having an active state and an inactive state, wherein said active state is longer than said inactive state;

track and latch means coupled to said decoder means for tracking said decoder output signal when said deadtime signal is in said active state and for latching and outputting said decoder output signal as said deadtime signal transitions to said inactive state; and, switching means responsive to the output of said track and latch means and having an output for coupling to one of the word enable lines for preventing enabling of the word enable line when said deadtime signal is in said active state and for enabling the word enable line when said deadtime signal has transitioned to said inactive state.

2. The circuit of claim 1 wherein said track and latch means comprises:

transmission means responsive to said deadtime signal for selectively passing said decoder output signal to an output of said transmission means, and a latch circuit coupled to said output of said transmission means for latching said decoder output signal when said transmission means is selected by said deadtime signal, said latch circuit blocks said output of said decoder.

3. The circuit of claim 1 wherein said switching means comprises a NOR gate having a pair of inputs, a first one of said inputs of said NOR gate being coupled to said deadtime signal.

4. The address decoder circuit according to claim 1 wherein said inactive state is generated occupying a minimum amount of time while allowing said switching means to operate.

5. The circuit according to claim 1 wherein said decoder means further comprises a SLEEP input for disabling the output of said decoder means.

6. The address decoder circuit according to claim 1 wherein said decoder means comprises a dynamic logic gate-based circuit.

7. The circuit of claim 1 further comprising means for generating a second clock signal that is delayed and inverted relative to said input clock signal, and wherein said deadtime signal generating means comprises logic means responsive to said input and second clock signals for generating said deadtime signal.

8. The circuit of claim 7 wherein said logic means comprises a NAND gate and a NOT gate, wherein an input of said NOT gate being connected to an output of said NAND gate.

9. The circuit of claim 1 wherein said input clock signal has a first state and a second state, and wherein said decoder means comprises (a) a precharge means responsive to said first state of said input clock signal for charging a decoder output node to generate said decoder output signal and (b) a plurality of input switches coupled to said decoder output node, said plurality of input switches for selectively maintaining said decoder output signal in response to said preselected combination when an evaluation means responsive to said second state of said input clock signal for discharging said decoder output node is active.

10. The circuit of claim 9 wherein said precharge means comprises a PMOS transistor switch capable of connecting a power source having a voltage to said decoder output node to charge said power source voltage during said first state of said input clock signal, wherein said decoder output signal is already present when said preselected combination is presented to said input switches during said second state of said input clock signal to thereby reduce a time delay of said decoder means in generating said decoder output signal.

11. The circuit of claim 10 wherein said evaluation means comprises an NMOS transistor switch operating to connect said charged decoder output node to ground during said second state of said input clock signal for a conditional discharge thereby unless said preselected combination is presented to said input switches, wherein said power source is isolated from ground to thereby reduce the power dissipation of said decoder means and remain at a precharged level.

12. The address decoder circuit according to claim 1 wherein said deadtime signal generating means is responsive to both said input clock signal as well as said second delayed clock signal for generating said active state and said inactive state.

13. The address decoder circuit according to claim 12 wherein said active state is two or more times as long as said inactive state.

14. The address decoder circuit according to claim 13 wherein said second delayed clock signal is generated from said input clock signal by one or more logic gates.

15. An address decoder circuit for use with memory means of the type having a plurality of word enable lines for providing nonoverlapping enabling of the word enable lines, comprising:

logic circuitry responsive to a memory word address having at least one bit for producing a plurality of preselected combinations of true and complemented address bits;

a plurality of cells each having an output for enabling a respective one of the word enable lines of the memory means in response to a respective one of said preselected combinations;

each cell comprising, decoder means coupled to said respective one of said preselected combinations for generating an output signal in response thereto;

deadtime signal generating means responsive to an input clock signal and a delayed clock signal for generating a deadtime signal having an active state and an inactive state wherein said active state is longer than said inactive state;

track and latch means coupled to said decoder means for tracking said decoder output signal when said deadtime signal is in said active state and for latching and outputting said decoder output signal as said deadtime signal transitions to said inactive state; and, switching means responsive to the output of said track and latch means and coupled to said cell output for preventing enabling of said respective word enable line when said deadtime signal is in said active state and for enabling the word enable line when said deadtime signal has transitioned to said inactive state;

wherein said input clock signal has a first state and a second state, and wherein said decoder means comprises a precharge means responsive to said first state of said input clock signal for charging a decoder output node to generate said decoder output signal, a plurality of input switches coupled to said decoder output node for selectively maintaining said decoder output signal in response to said respective preselected combination when an evaluation means responsive to said second state of said input clock signal for discharging said decoder output node is active; and, wherein each cell output is prevented from enabling the word enable lines while said track and latch means tracks said decoder output signal to thereby provide nonoverlapping word line enable.

16. In a memory system of the type having a plurality of word enable lines, a method of decoding a memory word address having nonoverlap word line enable, comprising the steps of:

(A) decoding the memory word address to generate word line signals each word line signal having an active state and an inactive state;

(B) generating a deadtime signal having an active state and an inactive state, wherein said active state is longer than said inactive state using an input clock signal;

(C) preventing enablement of the word enable lines while tracking the respective states of the word line signals using the deadtime signal to thereby prevent two or more word enable lines from being enabled when said deadtime signal is in said inactive state;

(D) latching the states of each word line signal using the deadtime signal; and, (E) enabling a selected word enable line using the latched word line signals.

\* \* \* \* \*